United States Patent [19]
Smith

[11] Patent Number: 4,522,283
[45] Date of Patent: Jun. 11, 1985

[54] NOISE MEASUREMENT

[75] Inventor: Michael J. T. Smith, Newark, England

[73] Assignee: Rolls-Royce Limited, London, England

[21] Appl. No.: 385,264

[22] Filed: Jun. 4, 1982

[30] Foreign Application Priority Data

Jun. 17, 1981 [GB] United Kingdom ................. 8118642

[51] Int. Cl.[3] ................................................ H05K 5/00
[52] U.S. Cl. ...................................... 181/175; 181/242
[58] Field of Search ............... 181/151, 157, 158, 175, 181/242, DIG. 1, 295, 166, 284, 0.05; 179/146 E, 146 H, 180, 181 R

[56] References Cited

U.S. PATENT DOCUMENTS

| | | | |
|---|---|---|---|
| 3,154,171 | 10/1964 | Knutson et al. | 181/242 X |
| 4,167,985 | 9/1979 | Dunlavy | 181/151 X |
| 4,314,098 | 2/1982 | Maerfeld | 181/175 X |

FOREIGN PATENT DOCUMENTS

| | | |
|---|---|---|
| 257204 | 8/1926 | United Kingdom . |
| 274511 | 7/1928 | United Kingdom . |

*Primary Examiner*—L. T. Hix
*Assistant Examiner*—Brian W. Brown
*Attorney, Agent, or Firm*—Cushman, Darby & Cushman

[57] ABSTRACT

A sound absorbent pad, which comprises an interconnected cellular foam or a fibrous material, has a central hole which houses a microphone whose sound-sensing diaphragm is held flush with the center of the outer surface of the pad. The pad is a shallow dome or other shape which converges from a large base to a vertex and incorporates a plastic or metal plate, which being frusto-conical or another suitable shape. The pad with its plate acts to control noise which would otherwise be reflected from noise reflecting surface onto the microphone, thereby facilitating measurement of freefield noise levels.

15 Claims, 9 Drawing Figures

TYPICAL MEASUREMENT ARRANGMENT

EFFECT OF SURFACE INTERFERENCE

NOISE MEASUREMENT

Figure 1:
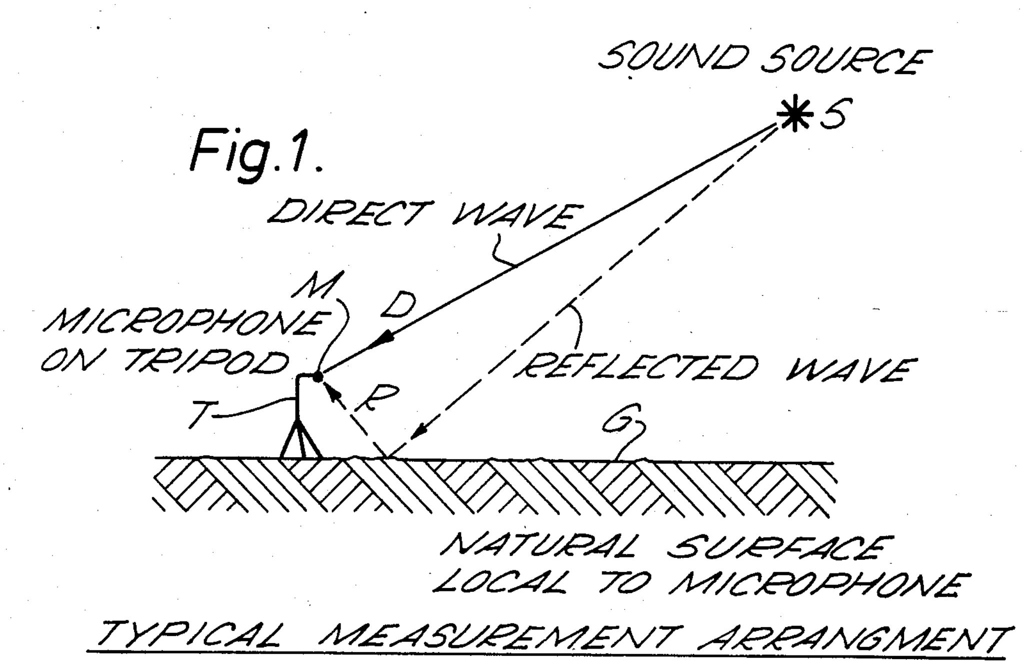

This invention relates to a device for facilitating sound intensity measurements near a sound-reflecting surface, and is particularly but not exclusively suited to facilitating the measurement of noise from gas turbine aero engines.

Monitoring of noise emanating from gas turbine aero-engines has become an important element in their design, development, airworthiness certification and operation in recent years because of the general desire to avoid exposure of communities to unnecessary noise nuisance. In order to build up complete noise profiles of engines or components thereof during tests, it is necessary to measure noise at all angular locations around the engine, including those locations below the centreline of the engine when it is mounted on the test stand, some of these locations being near the ground. "Far-field" noise measurements at test sites and airports are also made near ground-level or near rooftop level, as are measurements of noise during overflights of test-sites, airports or communities.

Unfortunately, measurement of radiated sound levels near the ground or other noise reflecting surface is complicated by the effects which the proximity of the ground has on the intensity and quality of the sound received by the microphones used to measure sound intensity. These effects include those due to reflection of sound from the ground and the attenuation of high frequency components by any layer of hot air near tarmacadam or other surfaces heated by solar radiation.

The present invention is aimed at reducing the effect which a sound-reflecting surface has on the sound received by a microphone situated near it.

According to the present invention, a device for facilitating sound intensity measurements near a sound-reflecting surface comprises a pad of sound absorbent material having a top surface and an underside, the pad having a large thickness at its center relative to its periphery, the underside of at least the periphery of the pad being intended to engage the sound reflecting surface, the thickness of the pad decreasing gradually between the center and the periphery thereby to provide a gradual change in acoustic impedance between the center of the top surface of the pad and the sound reflecting surface, the device having means for housing a microphone within a hole in the pad such that in use the microphone's sound-sensing portion can be positioned substantially flush with the top surface of the pad at the center thereof.

The device may additionally be described as comprising a pad of sound absorbent material having an overall shape which converges from a large basal area to a vertex thereby to provide a gradual change in acoustic impedance from the vertex of the pad to the sound-reflecting surface, at least the perimeter of the large basal area being intended to engage the sound-reflecting surface, the device having means for housing a microphone within a hole in the pad such that in use the microphone's sound-sensing portion can be positioned substantially at said vertex.

Preferably, the sound absorbent material has broad frequency band absorption characteristics and a high rate of attenuation of sound waves travelling therethrough, particularly in respect of sound at high audible frequencies. The sound absorbent material preferably comprises a plastic foam material of interconnected cellular structure, but elastomeric, metal or ceramic foams with the same type of structure could be used instead. Alternatively, the sound absorbent material could comprise a fibrous material.

The pad of sound absorbent material preferably incorporates a metal or plastic plate formed to a shape which converges from a large basal area to a narrower vertex area, the plate being located within the pad so that the vertex area is positioned underneath the sound-sensing portion of the microphone, thereby providing a sound-reflecting surface within the pad which is closer to the sound-sensing portion of the microphone than is the sound-reflecting surface beneath the pad when the device is positioned thereon, the plate acting to (a) reduce intensity of low frequency interference patterns at the microphone caused by reflection of low frequency sound from the sound-reflecting surface beneath the pad and (b) provide a gradual transition between the distance from the sound-reflecting surface beneath the pad to the microphone and the distance from the vertex area of the plate to the microphone.

The device (i.e. the pad) may be in the shape of a shallow dome or it may be facetted, e.g. in the shape of a shallow pyramid with a desired number of sides.

If the pad is dome-shaped, the plate within the pad is advantageously either in the shape of a truncated cone, or in the shape of a dome with a vertex portion removed. If the pad is pyramid-shaped then the plate is preferably in the shape of a truncated pyramid with the same number of sides as the pad, the sides of the pad and the plate being in registration with each other.

Means for holding a microphone within the hole in the pad may comprise a sleeve into which the microphone can be inserted as required. Such a sleeve is conveniently fixed to the top of the plate within the pad.

Figure 2:
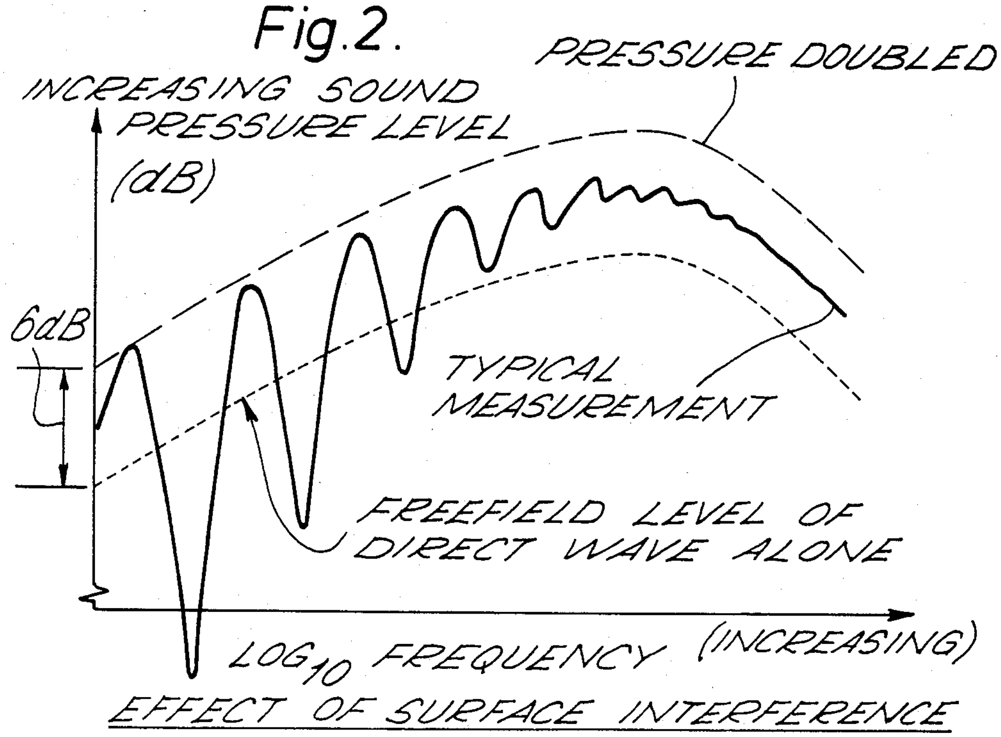
Figure 3:
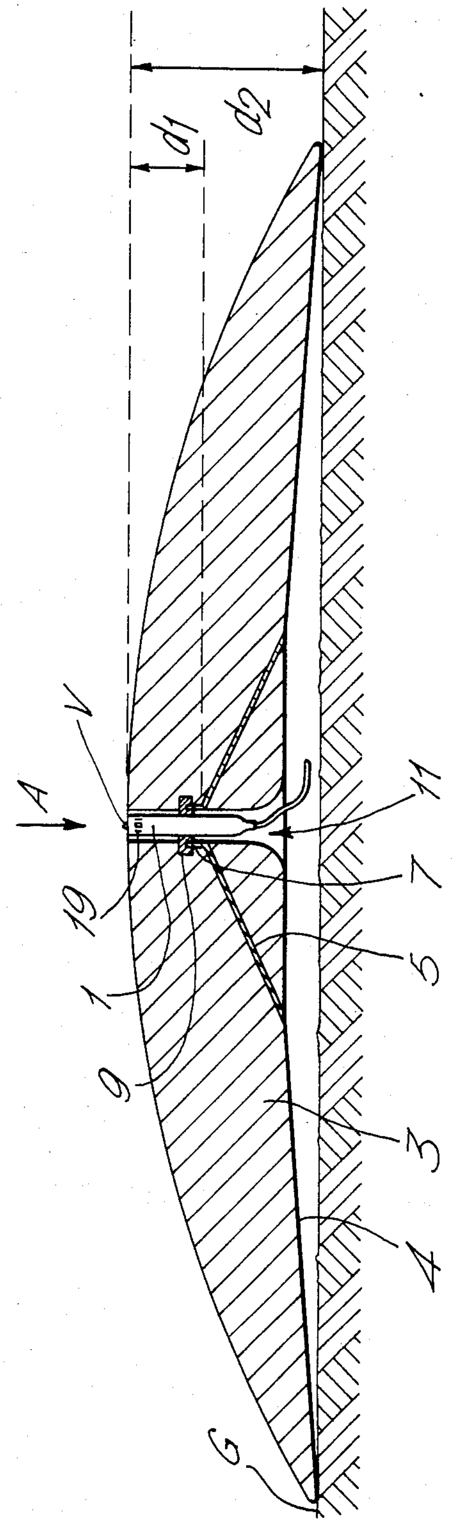
Figure 4:
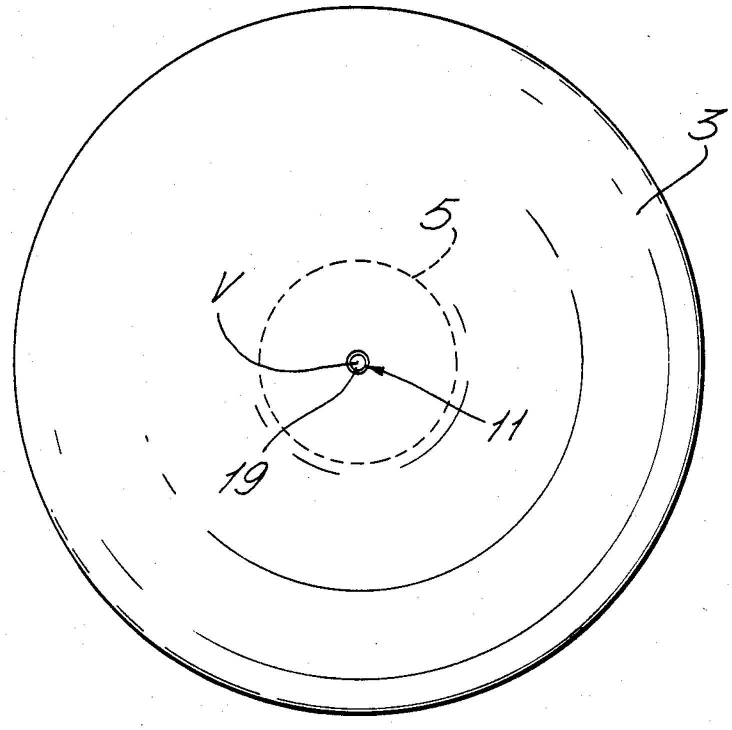
Figure 5:
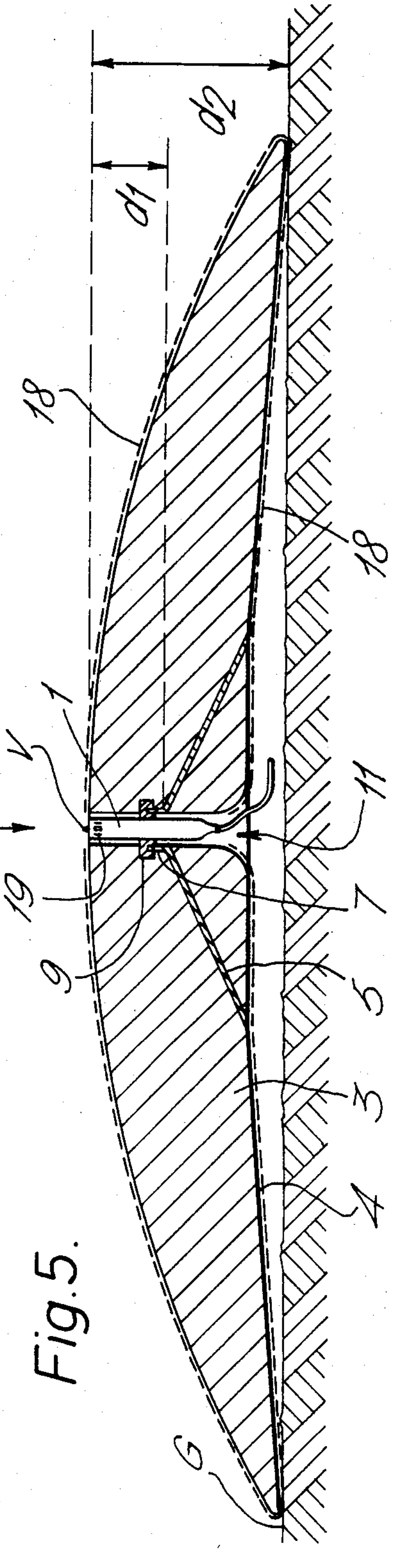
Figure 6:
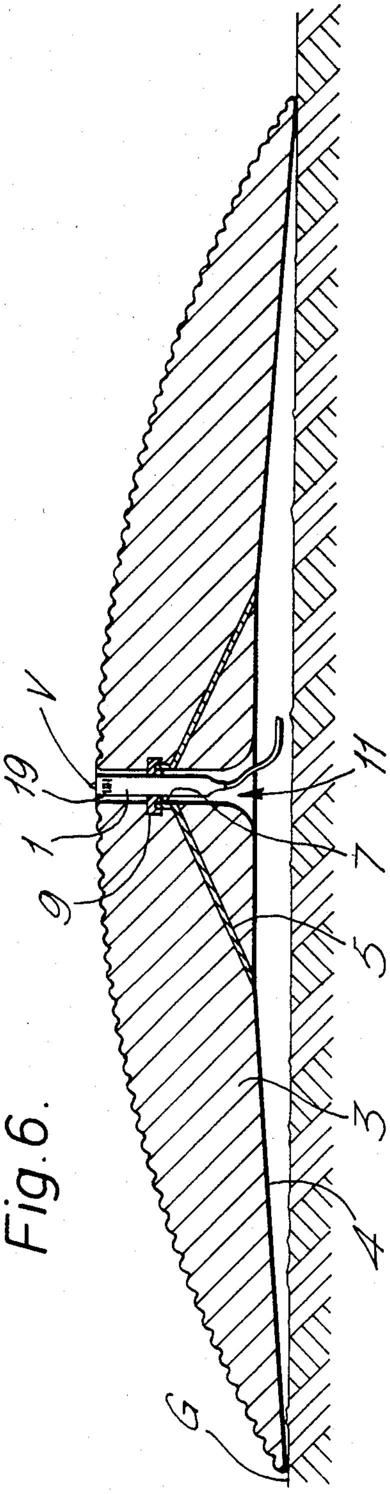
Figure 7:
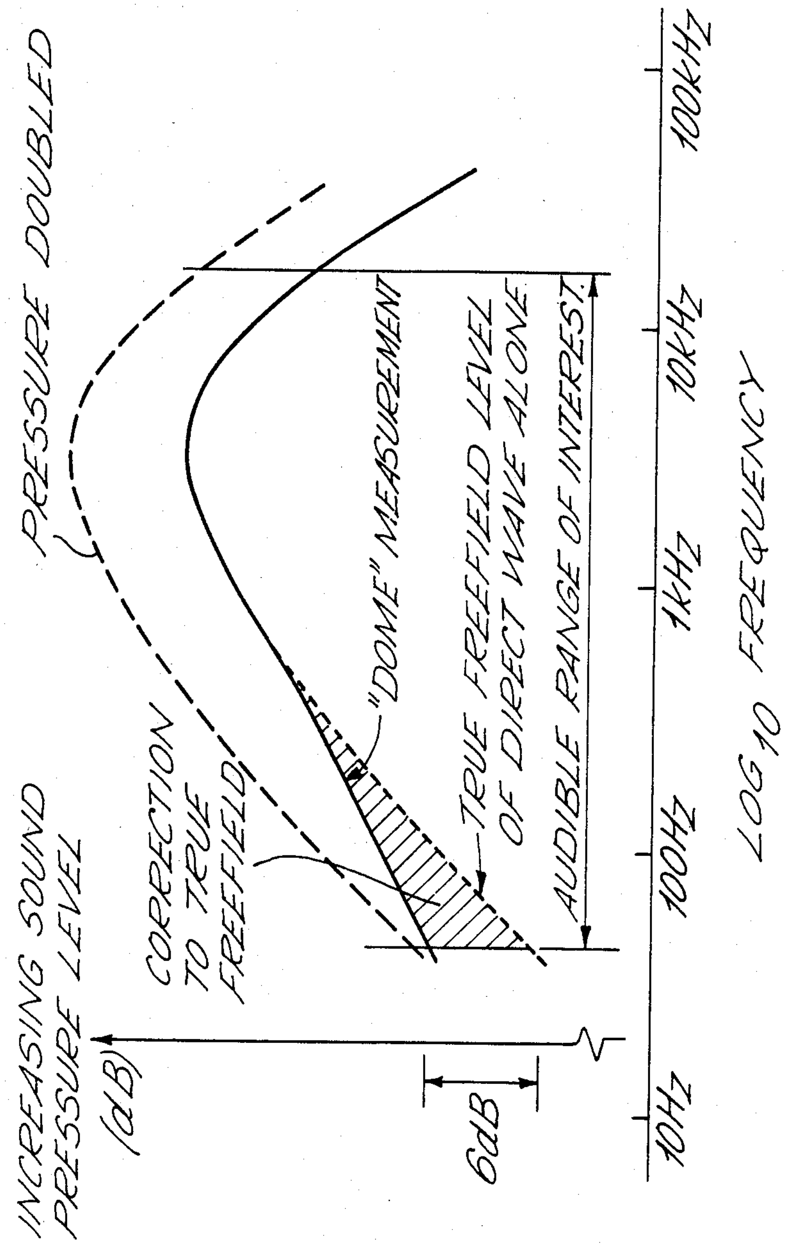

Embodiments of the invention will now be described by way of example only, with reference to the accompanying drawings, in which:

FIGS. 1 and 2 illustrate the effect of the proximity of a reflecting surface on sound measurements, FIG. 3 shows a diametral cross-section of a device according to the invention, revealing internal detail, FIG. 3*b* is a view similar to that of FIG. 3 but illustrating another embodiment where the pad is facetted shaped such as in pyramid form, FIG. 4 shows a plan view of the device in the direction of arrow A in FIG. 3, FIG. 4*b* shows a plan view of the embodiment of device of FIG. 3*b*, the view being in the direction of the arrow A in FIG. 3*b*, FIGS. 5 and 6 are views similar to that of FIGS. 3 and 3*b*, showing other embodiments of the invention, and FIG. 7 is a graph illustrating the effect of the invention on sound measurements.

The drawings are diagrammatic and are not to scale.

Referring to FIGS. 1 and 2, there is illustrated a difficulty encountered with noise measurements of an environmental nature where the sensing microphone M on tripod T (the microphone could also be hand held or on permanent fixings) is placed close to an environmental reflecting surface, such as the ground, G, which may be "hard" (e.g. tarmacadam, concrete) or "soft" (grass). Microphone M is placed at approximately one meter above the ground G (though permanent noise monitoring installations may be fixed at higher levels) and a source S radiates noise in a multi-directional manner. Microphone M is a part of a measuring system being used to obtain sound pressure level and sound spectral information and receives both the direct wave D from source S and a reflected wave R from the ground G around the microphone. If G is "hard" the reflected wave R can be almost as strong as, or, if the source is directional in nature, sometimes stronger than, the direct wave D. The two waves interfere in the region of the microphone M as a result of their differences in phase and amplitude and the microphone senses a signal which contains augmentations and cancellations in the spectrum as illustrated in FIG. 2.

Three spectra are shown in FIG. 2, in which sound pressure level in deciBels is plotted against the base ten logarithm of frequency. The lowest curve, shown by the dotted line, represents the true character of the sound source, i.e. the real freefield level of the direct wave alone, which would be measured by a microphone in free airspace without any reflecting surface nearby. Ideally, this is the level required to be measured, but which can only be measured under special experimental laboratory conditions. The top curve, shown by the dashed line, is the fully pressure doubled level (a 6 dB increase on the freefield curve) which would be measured by a microphone flush-mounted in an acoustically hard surface of infinite dimensions. In practice, this situation can only be approximated on very rare occasions. The other curve, shown by the full line, represents the sound spectrum as sensed by microphone M in FIG. 1, and it will be seen that due to augmentations and cancellations, particularly at the lower frequencies, the sound pressure level as sensed by the microphone is almost doubled at some frequencies and very much reduced at others.

The objective of most analytical sound measurement procedures is to describe the character of the sound source from the freefield sound pressure levels alone, but the interference pattern associated with reflected waves often distorts any conclusions. A further source of distortions is present when the reflecting surface is heated to higher than ambient temperatures, e.g. by solar radiation. The shallow layer of stagnant heated air next to the warm surface acts to attenuate high frequency components of sound reflected by that surface.

The interference pattern whose effects are shown in FIG. 2 depends upon:

(a) the source location (b) the distance of the microphone from the reflecting surface (c) the absorptive qualities of the surface, and (d) the directionality of the sound source.

Thus, the nearer the microphone to the surface, the higher the frequencies affected to a significant degree by the interference pattern; the "softer" or more absorbent the surface, the weaker the reflected waves; and the more directional the source, the greater the variability of the spectral level. Simply mounting a microphone at a standard distance above the surface cannot produce a repeatable standard for environmental sound measurement, since the properties of environmental surfaces cannot be standardised.

The invention tackles this problem by providing a controlled environment for the microphone in at least the mid-to-high frequency portion of the sound spectrum within the audible range (this being the portion of the spectrum in which the ear is most sensitive to noise) and allowing the low frequency end of the spectrum to be at least partially controlled by the environment. Most environmental surfaces are virtually "hard" to low frequencies.

As can be seen from FIGS. 3 and 4, the invention provides a microphone 1 with a controlled environment by locating it within a device comprising a shallow dome-shaped circular pad 3 of noise absorbing material (as indicated). The underside 4 of pad 3 is dished, i.e. somewhat concave, so that pad 3 engages the ground G only at its rim. Embedded within pad 3 is a frusto-conical metal or plastic plate 5 which may alternatively be dome-shaped like the pad 3. The plate 5 is bonded to the pad 3 on its inside and outside surfaces and its small or truncated end has an upstanding collar 7 on which is retained a rubber sleeve or bush 9. Bush 9 is sized so that a desired type of microphone 1 used for sound intensity measurements is a push fit for location within it. Bush 9 holds the microphone 1 with an internal cylindrical hole or passage 11 which extends through the axis of symmetry of the pad 3 from its underside 4 to its top outer surface. Passage 11 is formed directly in the pad 3 of noise-absorbing material.

Pad 3 is dome-shaped in the particular embodiment of FIG. 3, having its vertex at point V. However, other shapes which converge from a large basal area to a vertex may be used for the invention, e.g. facetted shapes such as pyramids FIGS. 3*b* and 4*b* in which the same numerals are utilized to identify the same or similar parts. The microphone is held in the passage 11 within the pad 3 so that its top portion 19 is flush or almost flush with the vertex V of the dome, this portion 19 being the sound sensing diaphragm portion of the microphone.

The pad 3 of noise-absorbent material advantageously consists of a suitable polyurethane foam with broad frequency band absorption characteristics, particularly at mid-range and high audible frequencies, and a high rate of attenuation of sound waves travelling therethrough. The foam has an interconnected cell structure, and other open-cell plastic, elastomeric, ceramic or metal foams could be used instead of polyurethane. These can be made in blocks or sheets and are easily cut to the shape of pad 3. To protect the exposed surface of the foam from damage due to knocks and abrasion, it may be advisable to provide the foam with a covering of a coarse plastic or wire mesh 18, indicated schematically in FIG. 5 by the dashed lines. Mesh 18 is rigid and forms the top outer surface and the underside of the device, but is substantially transparent to sound. The mesh 18 is course, to avoid excessive reflection of sound waves from it.

Referring still to FIG. 5, it is noted that instead of comprising foam material, pad 3 may be composed of a fibrous type of bulk material, such as ceramic, metal or synthetic fiber mats which may be cut to shape and (if more than one layer is used) stitched together. Such a pad must be held in shape and contained within a rigid mesh covering 18, the fibers being held somewhat in compression by the mesh envelope 18 to allow for compaction and settling of the fiber mats during use. In this case, the internal passage 11 would be lined with, similar wire or plastic mesh to retain its shape.

As an alternative to the use of wire or plastic mesh 18 for the outer surface of pad 3, it might be possible to use a sintered metallic felt of suitable stiffness and low acoustic impedance to cover the interior foam or fiber material.

A suitable minimum overall size for the device shown in FIGS. 3 to 5, is about 1000 mm in diameter at the base and about 120 mm from base to vertex, but differing dimensions and proportions are possible, depending upon the character of the sound to be measured. The larger the diameter and in height the device is, the more effective it becomes, particularly at low frequencies, but handling becomes a problem at large sizes. The 1000 mm diameter dimensions is considered typical for such purposes as aircraft or other community noise evaluation.

The important feature of shape of the pad 3 is its gradual decrease in the thickness from its center to its periphery and therefore its gradually decreasing influence on the reflected waves. The gradual decrease in thickness from center to rim of the device gives a gradual transition of acoustic impedance from that of the pad 3 at its center to that of the ground at the rim. A reflected wave—that is, a wave which in the absence of the device would strike the ground beneath and be reflected back to the microphone diaphragm—is absorbed to a progressively increasing degree the closer it is to the microphone, i.e. as the thickness of pad 3 increasesd. A dome-shaped pad of 1000 mm diameter at the rim and 120 mm high could be expected to absorb so much of the impinging high frequency sound that an insignificant level of reflected high frequency sound would be sensed by the microphone. However, the mid to low frequencies could still be attended by augmentation/cancellation effects, and the frusto-conical (or dome-shaped) metal plate 5 embedded in pad 3 is there in order to minimise these effects. The plate 5 provides both a reflecting surface in closer proximity to the microphone's diaphragm than the ground, and a gradual transition between minimum microphone-to-plate vertical distance $d_1$ and the microphone-to-ground vertical distance $d_2$. Low frequency waves, which would otherwise have propagated through pad 3 and would have reflected from ground G to cause interference patterns at the microphone, are reflected from plate 5 and are either reflected away from the microphone, or if reflected towards it, tend to cause interference patterns at a location above the microphone where they do not affect it. Those frequencies with a potential for causing interference patterns at the microphone after reflection off plate 5 will tend to be the high frequencies, which are in fact satisfactorily absorbed by pad 3.

Note that if measurement of the mid-to-low frequencies is not desired, plate 5 could be deleted, microphone 1 being held by a sleeve fixed solely to the sides of passage 11. Further, if pad 3 is pyramidal in shape, then plate 5 could be formed to the shape of a truncated pyramid with the same number of sides as the pad, the sides of the pad 3 and plate 5 being in registration with each other. The basal area and height of a cone-, dome-, or pyramid-shaped plate 5 may be selected to give optimum effect at the mircophone according to the frequency range it is desired to measure. In general, dimension $d_1$ is likely to be about half dimension $d_2$.

In use, the microphone is pushed into place from the underneath of the device, and the device is placed on the ground or other surface at a desired location. The device being particularly light in weight if comprising a plastic foam pad, may also be provided with means (not shown) such as adhesive pads, for fixing it to steeply inclined or vertical surfaces if it is desired to measure noise intensity next to such surfaces. Noise impinging against the surface of pad 3 is mostly transmitted into the interior of the pad, where a high proportion of it is dissipated within the foam or fiber material. A small portion of the incoming noise is reflected from the mesh 18 (if present) and the surface of the pad, but this reflected noise does is of low intensity and most of it does not reach the microphone 1 because the microphone is buried in the pad so that its sound-receiving portion 19 is not exposed in a position to directly intercept any reflected noise, and because the domed shape of the pad scatters the noise away from the microphone. In order to scatter the noise more effectively, and provide a greater area for sound-absorption, the outer surface of foam pad 3 may be dimpled as indicated in FIG. 6, or may even be formed with wedge features, i.e. triangular waveform ripples, all other features of the device remaining as in FIG. 3.

The device acts to shield and isolate the microphone 1 from the ground G or other surface on which it is placed. It provides the microphone 1 with a controlled environment by preventing sound from reflecting back to the microphone from ground G under the device. It also minimises the amount of noise reaching the microphone after reflection from the ground surface beyond the periphery of the device. Further it isolates the microphone from sound reflection/refraction and attenuation effects due to the layer of hot stagnant air which forms close to the ground G or other heat-absorbing surface when such a surface is warmed by the sun. In order to avoid too much heating of the device itself by solar radiation, it is preferable to ensure that at least the outer surface of pad 3 is white or otherwise of a heat reflective nature. Preferably any foam or fibrous material used in pad 3 is itself white or heat reflective.

It will be apparent that substantially all the noise which actually reaches the sound-receiving portion 19 of microphone 1 is therefore coming directly from the sound-source under investigation, assuming of course that the device has been positioned relative to the sound source so as to allow direct propagation of sound waves from the source to the sound-receiving portion 19 of microphone 1. The microphone 1 is therefore being enabled to sense the noise almost as though the ground G were not there, i.e. the device enables the microphone to experience a reasonable approximation to the sound intensity and quality in a free sound field. This is illustrated in FIG. 7, which shows the effect of the device in terms of the measured spectral character of the sound. Three spectra are shown, as in FIG. 2, the lowest and highest curves being the freefield and pressure-doubled spectra as before, and the middle spectrum, shown by a full line, being a plot of the sound as received by the microphone 1 in FIGS. 3 and 4. At very low audible frequencies, the ground G is almost acoustically hard to the impinging sound waves, and the measured sound level is dictated more by the natural environment than by the device itself. At very low frequencies the microphone is effectively in the surface G and pressure doubling is realised. At higher frequencies, typically those above 1 KHz, the waves (impinging and reflected) are substantially completely absorbed by the pad 3 and the measured sound level is substantially freefield in nature. Between 1 KHz and the low frequency pressure doubled region, the impinging and reflected waves are progressively less affected by the absorptive qualities of the pad 3. Since the device specified would be of known and regular dimensions, its behaviour can be defined under laboratory conditions and a correction from the measured level to the real freefield level specified with considerable accuracy.

I claim:

1. A device for facilitating sound intensity measurements near a sound-reflecting surface, comprising:

a pad of sound absorbent material having an overall shape which converges from a large basal area to a vertex thereby to provide a gradual change in acoustic impedance from said vertex of said pad to said sound-reflecting surface, at least the perimeter of said large basal area being intended to engage said sound-reflecting surface, and means for housing a microphone within a hole in said pad such that in use said microphone's sound-sensing portion can be positioned substantially at said vertex.

2. A device according to claim 1 in which said sound absorbent material has broad frequency band absorption characteristics and a high rate of attenuation of sound waves travelling therethrough.

3. A device according to claim 2 in which said broad frequency band absorption characteristics of said sound absorbent material are in respect of sound at high audible frequencies.

4. A device according to claim 1 in which said sound absorbent material comprises a foam material of interconnected cellular structure.

5. A device according to claim 4 in which said foam material is a polyurethane plastic.

6. A device according to claim 1 in which said sound absorbent material comprises a fibrous material.

7. A device for facilitating sound intensity measurements near a sound-reflecting surface, comprising:

a pad of sound absorbent material having an overall shape which converges from a large basal area to a vertex thereby to provide a gradual change in acoustic impedance from said vertex of said pad to said sound-reflecting surface, at least the perimeter of said large basal area being intended to engage said sound-reflecting surface, and means for housing a microphone within a hole in said pad such that in use said microphone's sound-sensing portion can be positioned substantially at said vertex, the pad incorporating a plate having a shape which converges from a relatively large basal area to a narrower vertex area, said plate having a basal area and a base-to vertex dimension which are substantially smaller than the corresponding dimensions of said pad, said plate being positioned within said pad so that said vertex area is positioned underneath said sound-sensing portion of said microphone, thereby providing a sound-reflecting surface within said pad which is closer to said sound-sensing portion of said microphone than is said sound-reflecting surface beneath said device when said device is positioned thereon, whereby said plate acts to reduce the intensity of low frequency interference pattern at said microphone caused by reflection of low frequency and sound from said sound-reflecting surface beneath said device.

8. A device according to claim 7 in which said pad is in the shape of a shallow cone.

9. A device according to claim 7 in which said pad is in the shape of a shallow dome and said plate within said pad is in the shape of a truncated cone.

10. A device according to claim 7 in which said pad is in the shape of a shallow dome and said plate within said pad is in the shape of a dome with a vertex portion thereof removed.

11. A device according to claim 7 in which said pad is in the shape of a shallow pyramid.

12. A device according to claim 7 in which said pad is in the shape of a shallow pyramid and said plate within said pad is in the shape of a truncated pyramid with the same number of sides as said pad, said sides of said pad and said plate being in registration with each other.

13. A device according to claim 1 in which said means for housing a microphone within said hole in said pad comprises a sleeve into which said microphone is insertable.

14. A device according to claim 1 in which said pad is in the shape of a shallow dome.

15. A device according to claim 1 in which said pad is in the shape of a shallow pyramid.

* * * * *